(12) United States Patent
Lin

(10) Patent No.: US 6,629,848 B2
(45) Date of Patent: Oct. 7, 2003

(54) METHOD FOR PROVIDING UNIFORM PRESSURE

(75) Inventor: Wen Kuan Lin, Taipei (TW)

(73) Assignee: Silitek Corporation, Taipei (TW)

( * ) Notice: Subject to any disclaimer, the term of this patent is extended or adjusted under 35 U.S.C. 154(b) by 0 days.

(21) Appl. No.: 09/987,511

(22) Filed: Nov. 15, 2001

(65) Prior Publication Data
US 2003/0092295 A1 May 15, 2003

(51) Int. Cl.⁷ .............................. H01R 12/00
(52) U.S. Cl. ........................ 439/67; 439/493
(58) Field of Search ................ 439/67, 493, 65, 439/492, 494

(56) References Cited

U.S. PATENT DOCUMENTS 3,940,786 A * 2/1976 Scheingold et al.
4,035,046 A * 7/1977 Kloth
4,194,800 A * 3/1980 Chow

* cited by examiner

Primary Examiner—Khiem Nguyen
(74) Attorney, Agent, or Firm—Rosenberg, Klein & Lee

(57) ABSTRACT

A method provides uniform pressure to contacts electrically jointing a first circuit board (a flexible circuit board) and a second circuit board (a flexible circuit board or a rigid circuit board), wherein the first circuit board is lapped on the second circuit board and an elastomer is provided and exerts pressure on the contacts. At least one fixing point is provided atop the transverse of the elastomer to uniformly distribute a pressing force of the elastomer on the contacts. Therefore, the elastomer is not deformed by high temperature process.

7 Claims, 5 Drawing Sheets

METHOD FOR PROVIDING UNIFORM PRESSURE

FIELD OF THE INVENTION

The present invention relates to a method for providing uniform pressure, especially to a method for providing uniform pressure to interconnection contacts electrically jointing two circuit boards.

BACKGROUND OF THE INVENTION

As shown in FIGS. 1A to 1C, the interconnection contacts electrically jointing two circuit boards can be formed by pressing. For example, a flexible circuit board such as a membrane 10a is lapped on a rigid circuit board such as a printed circuit board 20a and an elastomer such as a foam 30a is placed atop the membrane 10a. An upper case 40a and a lower case 50a are placed atop and below the resulting structure. Moreover, a plurality of screws 60a are screwed to the upper case 40a and the lower case 50a to fix both ends of the foam 30a. Therefore, the screws 60a are functioned as fixing points in this structure.

However, in above-mentioned contact structure, the upper case 40a and the lower case 50a have deformation problem and the contacts are subjected to nonuniform pressure due to the retaining action of the screws 60a. The problem is worsened when the interconnection contacts in a high temperature environment. In this situation, the deformation of the upper case 40a and the lower case 50a are more serious and the contacts between the membrane 10a and the printed circuit board 20a have open-circuit problem, as shown in FIGS. 3A and 3B.

To overcome above problem, the foam was developed to have different shape to reduce pressure and to reduce non-uniformity. Alternatively, a metal plate is placed on the foam to reduce nonuniformity. Alternatively, a setting screw is locked on a center portion of the foam, wherein the maximal deformation is occurred. However, the above measures have no satisfactory result.

The problem is exploited by the inventor and it is found that the problem of deformation is caused by the counter action force of the foam exerting on the cases after the screws are tightened. Both ends of the foam function as fulcrum of a lever system and the fixing screws function as force-exerting points. The deformation is increased along an axial line of the foam and has maximum at the center of the foam. Therefore, the ends of the foam have fulcrum effect to the contact structure.

FIG. 2C depicts the deformation of the foam (denoted as y1, y2, . . . etc) along the axial line of the foam (denoted as x1, x2, . . . etc). As can be seen from this figure, in an attempt to reduce deformation of the form at center portion thereof, the locking force of the screw is increased. However, the deformation of cases 40a and 50a is worse as the locking force of the screw is increased, as shown in FIG. 2A.

SUMMARY OF THE INVENTION

It is the object of the present invention to provide a method for providing uniform pressure to interconnection contacts such that the deformation due to high temperature process is prevented.

To achieve above object, the present invention provides method provides uniform pressure to contacts electrically jointing a first circuit board and a second circuit board, wherein the first circuit board is lapped on the second circuit board and an elastomer (e.g. a foam) is provided and exerts pressure on the contacts. At least one fixing point is provided atop the transverse of the elastomer to uniformly distribute a pressing force of the foam on the contacts.

The various objects and advantages of the present invention will be more readily understood from the following detailed description when read in conjunction with the appended drawing, in which:

DETAILED DESCRIPTION OF THE INVENTION

Figure 1A:
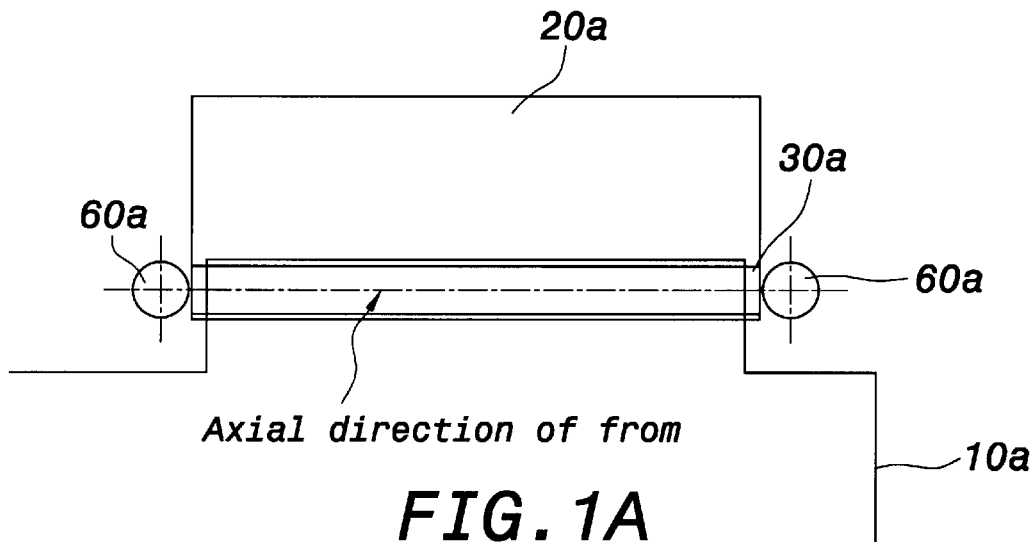
FIG. 1A shows a top view of a prior art pressing type contact.
Figure 1B:
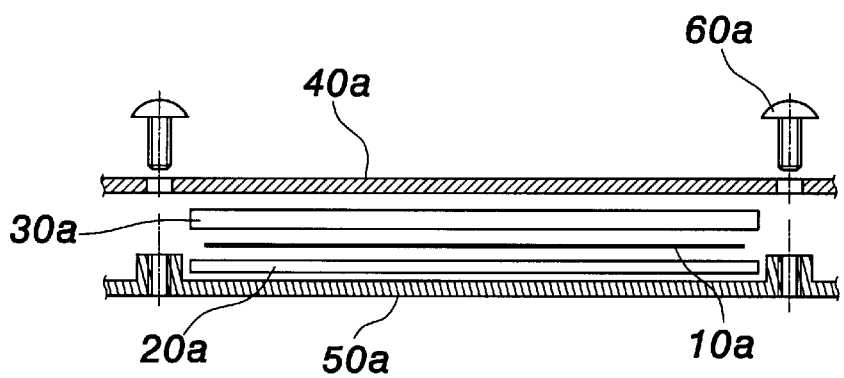
FIG. 1B shows a sectional view of a prior art pressing type contact before assembling.
Figure 1C:
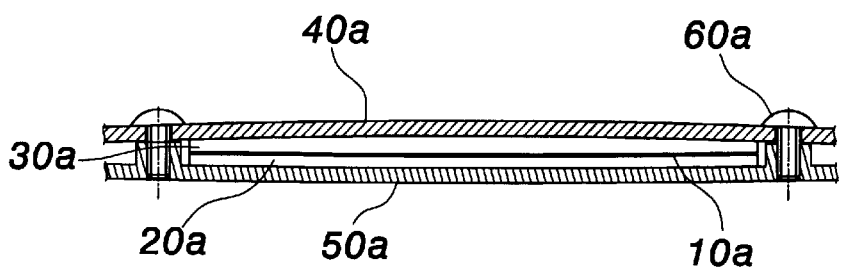
FIG. 1C shows a sectional view of a prior art pressing type contact after assembling.
Figure 2A:
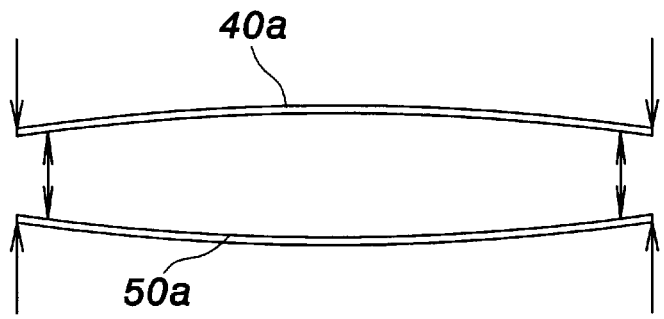
FIG. 2A shows the deformation of cases in prior art pressing type contact.
Figure 2B:
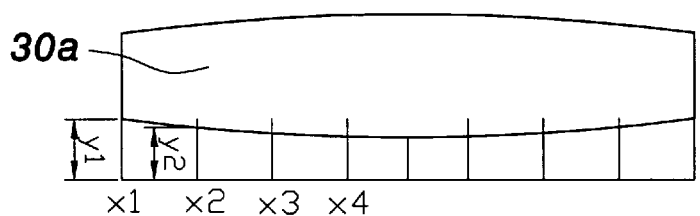
FIG. 2B depicts the deformation of form in prior art pressing type contact.
Figure 2C:
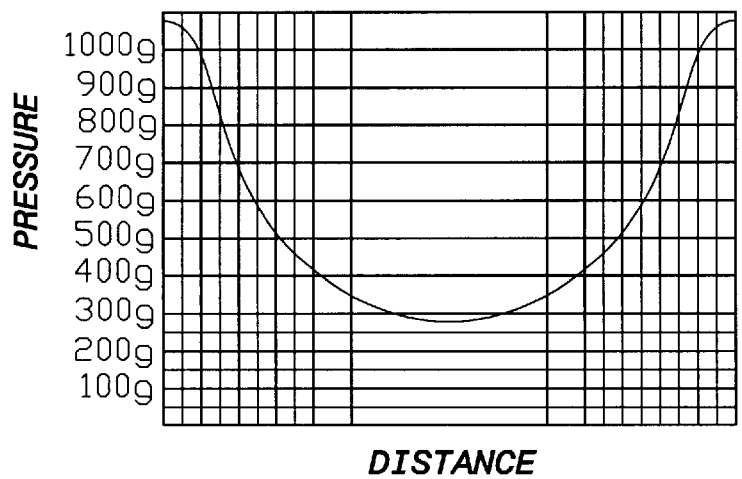
FIG. 2C is a view showing the pressure distribution in prior art pressing type contact.
Figure 3A:
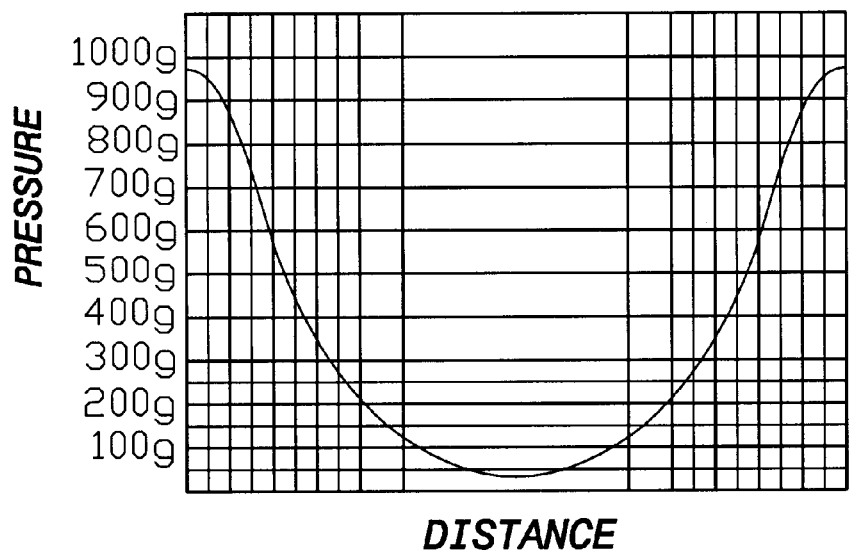
FIG. 3A is another view showing the pressure distribution in prior art pressing type contact.
Figure 3B:
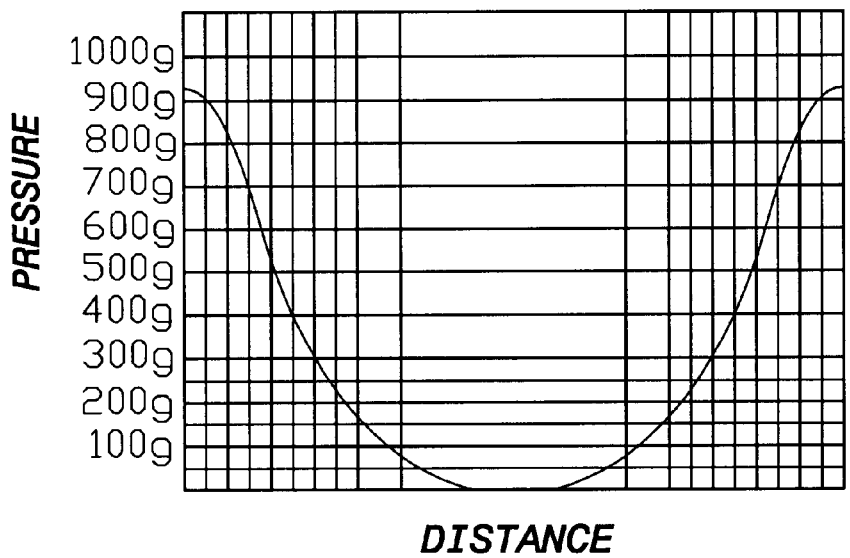
FIG. 3B is still another view showing the pressure distribution in prior art pressing type contact.
Figure 4A:
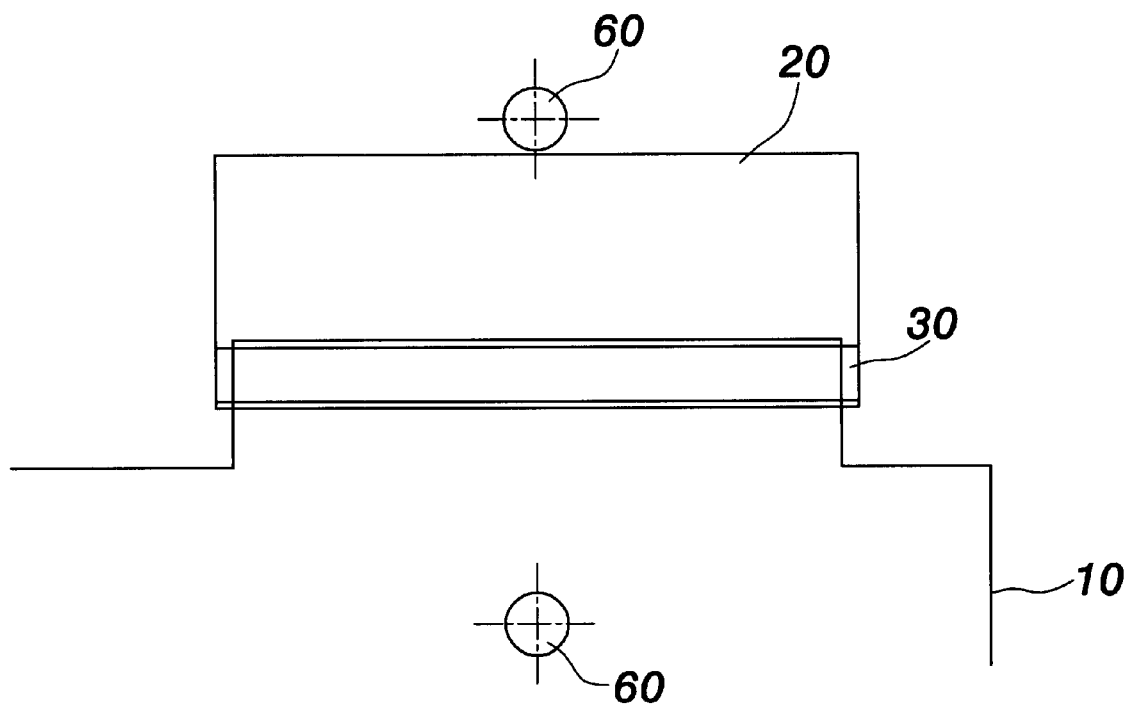
FIG. 4A shows a top view of present invention.
Figure 4B:
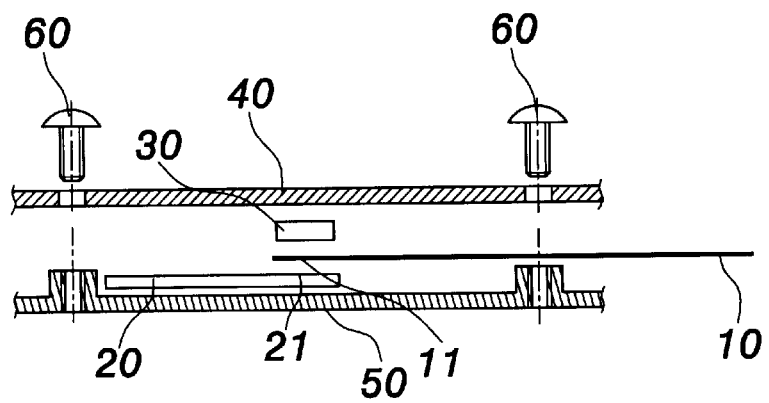
FIG. 4B shows a sectional view of pressing type contact of the present invention before assembling.
Figure 4C:
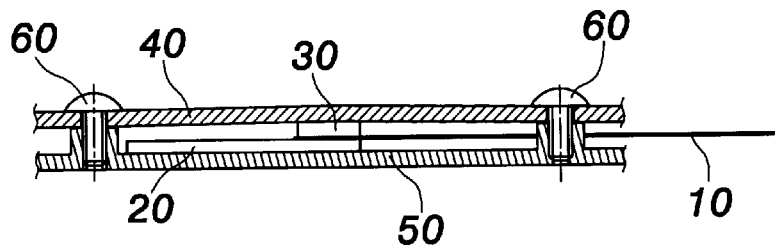
FIG. 4C shows a sectional view of pressing type contact of the present invention after assembling.

As shown in FIGS. 4A to 4C, the present invention is intended to provide a method for providing uniform pressure to interconnection contacts electrically jointing two circuit boards. The circuit board can be either flexible circuit board or rigid circuit board and pressure is exerted on those circuit boards to form interconnection contacts thereon. As shown in those figures, a first circuit board 10 is lapped on a second circuit board 20; wherein the first circuit board 10 is a flexible circuit board, and the second circuit board 20 is one of the flexible circuit board and the rigid circuit board. The first circuit board 10 has a plurality of first contacts 11 and the second circuit board 20 has corresponding second contacts 21; wherein the first contacts 11 are lapped atop corresponding second contacts 21. A foam 30 is placed atop the first contacts 11 and the second contacts 21. An upper case 40 and a lower case 50 are placed atop and below the resulting structure to enclose the foam 30, and the upper case 40 and the lower case 50 together form an outer casing of this structure. Moreover, a plurality of screws 60 are screwed to the upper case 40 and the lower case 50 to function as fixing points in this structure.

In the present invention, the screws 60 are positioned atop both sides transverse of the foam 30, as shown in FIG. 4A. The screws 60 can be arranged either in symmetry way or asymmetry way as long as the foam 30 is subjected to uniform pressure.

Figure 5:
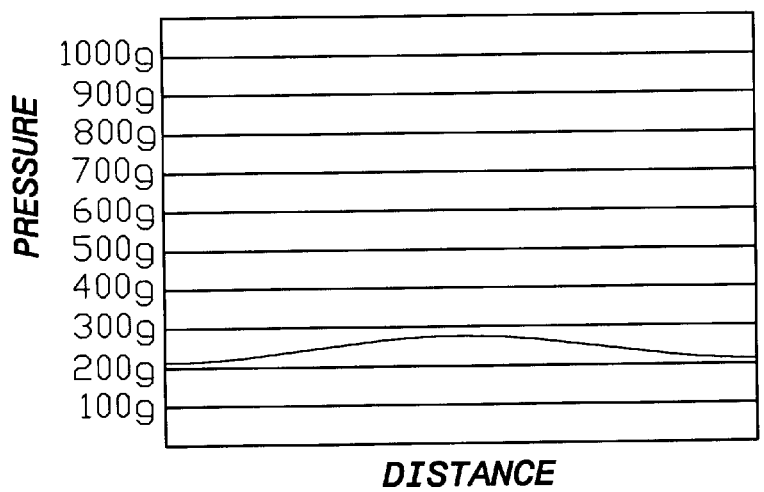
FIG. 5 is a view showing the pressure distribution in pressing type contact of the present invention.

To sum up, in the present invention, the screws 60 are removed from axial extension of the foam 30 such that the above-mentioned fulcrum effect can be prevented. The outer casing formed by the upper case 40 and the lower case 50 has only slight elastic deformation after high temperature process as shown in FIG. 5. The slight elastic deformation of the outer casing can advantageously press the foam 30 to prevent the deformation of the foam 30 after high temperature process.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A method for providing uniform pressure to contacts comprising the steps of:

electrically jointing a first circuit board and a second circuit board, the first circuit board being lapped on the second circuit board and an elongate elastomer being provided to extend longitudinally along and exert pressure on the contacts, the elastomer having longitudinally opposed ends and a pair of opposed side edges extending intermediately therebetween;

capturing the contacts and elastomer between first and second outer casing members each defining a planar inner surface projecting transversely beyond both opposed side edges of the elastomer; and, forming at least a pair of fixing points positioned respectively on opposed lateral sides of the elastomer, each transversely offset from an intermediate portion of one side edge of the elastomer to uniformly distribute a pressing force of the elastomer on the contacts.

2. The method for providing uniform pressure as in claim 1, wherein the first circuit board is a flexible circuit board.

3. The method for providing uniform pressure as in claim 1, wherein the second circuit board is one of a flexible circuit board and a rigid circuit board.

4. The method for providing uniform pressure as in claim 1, wherein the fixing points are symmetrically distributed about the elastomer.

5. The method for providing uniform pressure as in claim 1, wherein the fixing points are each realized by a screw.

6. The method for providing uniform pressure as in claim 1, the fixing points are formed to lock together the first and second outer casing members.

7. The method for providing uniform pressure as in claim 1, wherein the fixing points are asymmetrically distributed about the elastomer.

* * * * *